(12) United States Patent
Pavier et al.

(10) Patent No.: US 8,089,147 B2
(45) Date of Patent: Jan. 3, 2012

(54) IMS FORMED AS CAN FOR SEMICONDUCTOR HOUSING

(75) Inventors: Mark Pavier, West Sussex (GB); David Bushnell, Surrey (GB)

(73) Assignee: International Rectifier Corporation, El Segundo, CA (US)

( * ) Notice: Subject to any disclaimer, the term of this patent is extended or adjusted under 35 U.S.C. 154(b) by 507 days.

(21) Appl. No.: 11/591,834

(22) Filed: Nov. 2, 2006

(65) Prior Publication Data

US 2007/0096274 A1 May 3, 2007

Related U.S. Application Data

(60) Provisional application No. 60/732,625, filed on Nov. 2, 2005.

(51) Int. Cl.
*H01L 23/34* (2006.01)

(52) U.S. Cl. . 257/724; 257/723; 257/736; 257/E23.054; 257/E23.106; 257/E23.183

(58) Field of Classification Search .......................... None
See application file for complete search history.

(56) References Cited

U.S. PATENT DOCUMENTS

| | | | |
|---|---|---|---|
| 5,639,990 A * | 6/1997 | Nishihara et al. | 174/527 |
| 6,624,522 B2 | 9/2003 | Standing et al. | |
| 6,677,669 B2 | 1/2004 | Standing | |
| 7,095,099 B2 | 8/2006 | Oliver et al. | |
| 2003/0137040 A1* | 7/2003 | Standing | 257/685 |
| 2004/0169266 A1* | 9/2004 | Maxwell | 257/684 |

* cited by examiner

*Primary Examiner* — Minh-Loan T Tran
*Assistant Examiner* — Leslie Pilar Cruz
(74) *Attorney, Agent, or Firm* — Farjami & Farjami LLP

(57) ABSTRACT

An insulated metal substrate composite has a patterned conductive layer on one surface and receives one or more electrodes of MOSFETs or other die on the patterned segments which lead to the edge of the IMS. The outer periphery of the IMS is cupped or bent to form a shallow can with two or more die fixed to and thermally coupled to the flat web of the can while electrodes on the die surfaces thermally coupled to the web of the can lead to terminals on the rim of the can which are coplanar with the bottom surfaces of the die. The electrodes can be externally or internally connected to form a half bridge circuit.

20 Claims, 4 Drawing Sheets

IMS FORMED AS CAN FOR SEMICONDUCTOR HOUSING

RELATED APPLICATIONS

This application claims the benefit of U.S. Provisional Application No. 60/732,625, filed Nov. 2, 2005, the entire disclosure of which is incorporated by reference herein.

FIELD OF THE INVENTION

This invention relates to semiconductor devices and more specifically relates to a novel package for semiconductor devices.

BACKGROUND OF THE INVENTION

U.S. Pat. No. 6,624,522 (IR-1830) shows a semiconductor package known by the trademark Direct FET, a trademark of the International Rectifier Corporation, in which semiconductor die are contained within a conductive clip or flat cup with one surface of the die connected to the interior surface of the clip and with the opposite surface and its electrodes generally coplanar with the bottom of the clip so that it can be conductively fastened to a support circuit board. The clip itself may be a contact for electrodes of the die connected to the interior of the clip, with all device electrodes being available for connection to the contact patterns of the flat circuit board.

It is frequently desirable to copack plural die in such a package, for example, to form a half-bridge topology in a single package for such applications as a synchronous buck converter, lighting controls, class D audio circuits and the like.

FIG. 1 shows a typical half bridge circuit consisting of series connected power MOSFETs 20 and 21 having gates G1 and G2 respectively. The series circuit is connected to upper terminal V(+) and lower terminal V(−), which may be ground potential, and an output central terminal "out".

It would be very desirable to house MOSFETs 20 and 21 in a single common housing, schematically shown by dotted rectangle 22, with the 5 terminals accessible for easy connection to the terminals of a flat circuit board as by soldering or conductive cements, or the like. The circuit board may be of any desired material, such as IMS, DBC, FR4 or the like. The shape of the board can be any shape desired.

By copacking the two MOSFETs 20 and 21 (or any other circuit component) customer part count is reduced and parasitic inductance and resistance is reduced.

The present Direct FET package format only allows for copackaged die with a common drain at the node between the die. Thus it is not suitable for a half bridge circuit such as that of FIG. 1 in which the source of FET 20 is connected to the drain of FET 21. Thus, added connection tabs are needed for this purpose as shown in U.S. Pat. No. 6,677,669 (IR-2107) for plural MOSFETs in a Direct FET package.

Consequently, copacks without a common drain have required wire bonded packages such as the SO-8, or the 5 lead TO-220 packages. See for example, U.S. Pat. No. 7,095,099 (IR-2613). These, however, will have a higher inductance and higher $R_{DSON}$ than a copack in a Direct FET package and have poorer thermal performance than that of the Direct FET packages.

It is very desirable to be able to employ the Direct FET type package for copacked FETs without a common drain connection and without the need for wire bonds or special clips, or the formation of a patterned insulation layer inside the can or clip to insulate at least one of the FET terminals from the conductive clip.

BRIEF DESCRIPTION OF THE INVENTION

An insulated metal substrate (IMS) or any other composite substrate which can be stamped or formed to a clip shape is employed for the housing clip. The IMS substrate is comprised of a relatively thick conductive copper or aluminum layer with a thin dielectric layer bonded to one surface and a thin conductive layer bonded to the opposite surface of the thin dielectric layer. The thin conductive layer is thin enough to be easily patterned by conventional etch techniques. Thus, the conductive layer can be patterned to form tracks to interconnect plural MOSFET die electrodes or to carry the electrodes to suitable terminal locations on the rim of the clip. The IMS board is constructed and shaped, as by stamping, to bend it at its edges to form the Direct FET package type clip edge which is coplanar with the MOSFET die electrodes at the open bottom of the clip for easy connection to the cooperating patterns on a circuit board. The board can be shaped before or after the desired track pattern is formed in the thin conductive layer. The die attach to the clip interior can be made by nozzle dispensed solder paste or conductive epoxy; by an anisotropic conducting film (ACF) or by any other desired technique. If desired, the composite can be formed of the known Direct FET type can shown in U.S. Pat. No. 6,677,669 above, with a dielectric coating on its interior and a patternable conductive layer on the dielectric coating.

Other methods of manufacturing the composite substrate are available. For example, a thin, flexible circuit board having patterned traces can be laminated or adhered to the inside of a prestamped lead frame.

The drain, source and gate contacts of each die can be mounted in a variety of ways, and the conductive tracks formed inside the can are appropriately adjusted.

In one embodiment, the source and gate of each of the MOSFETs face the inside of the shallow flat "can" and are connected to respective tracks which lead to outer terminal contacts. Thus, the source and gate contact terminals are on the rim of the can and the drain contacts of each die are on the free surfaces of the die suspended from the can. All terminals are coplanar and can be interconnected as desired in the circuit board receiving the terminals. Of course, the die are closely thermally connected to the relatively thick conductor of the composite can structure.

The benefit of this arrangement of electrodes is that it permits mounting of smaller die in the package than a customer could otherwise handle in their conventional pick-and-place and soldering operations. This is a consequence of being able to achieve higher placement accuracy and process control in forming the solder joints.

Second, removing the substrate as the switch node in the half bridge will reduce EMI noise generated by the package and also isolates any heat sink placed on the package from any live terminal.

It is of course possible to connect the source of the high side FET to the drain of the low side FET by inverting one of the die, and connecting the source and drain terminals to the conductive substrate of the IMS.

The benefits of the novel invention are:
Reduced component count;
Reduced footprint, as compared to two separate packages;
Compared to wire bonded packages; a reduced inductance; reduced $R_{DSON}$; improved thermal performance;

Permits copacking of an IC control die with one or more MOSFET die;
Simplifies the assembly process.

DETAILED DESCRIPTION OF THE PREFERRED EMBODIMENT

Figure 1:
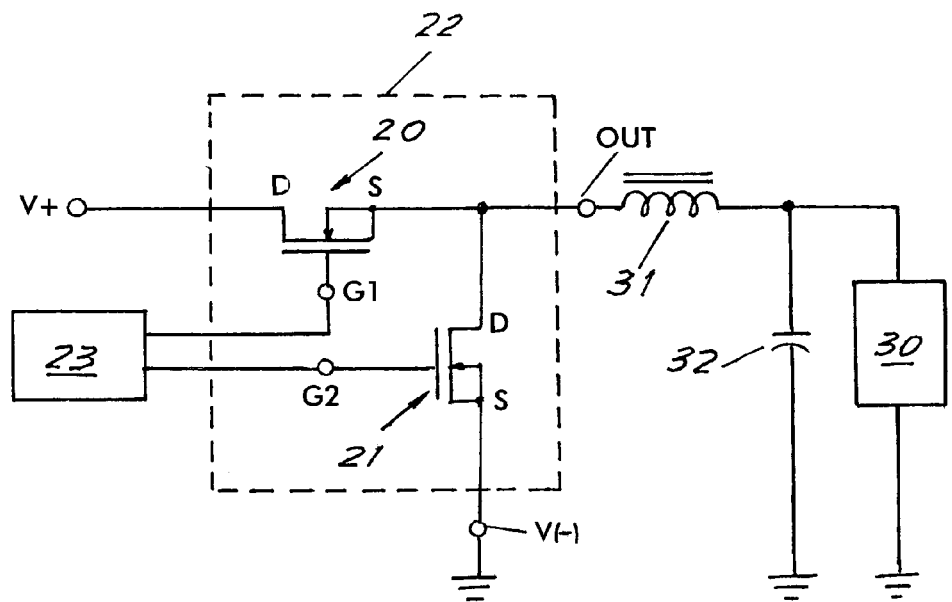
FIG. 1 is a circuit diagram of a buck converter circuit in which the two MOSFETs can be copacked.

Referring first to FIG. 1, the circuit shown is a buck converter circuit comprising a control MOSFET 20, a synchronous MOSFET 21 and a control IC 23 which controls FETs 20 and 21 as usual. An input d-c voltage is applied to terminal V(+) and to the half bridge circuit formed by FETs 20 and 21. The source S of FET 21 is connected to terminal V(−) (or ground) and the node of the source terminal of FET 20 and the drain terminal of FET 21 is connected to output terminal "out". The output terminal then has an appropriate voltage connected to load 30 through inductor 31 and output capacitor 32.

In accordance with the invention, FETs 20 and 21 are copacked in the common housing 22, which is a Direct FET style housing as will be described.

Each of MOSFETs 20 and 21 can have any desired structure and topology and can be planar or trench type devices. More specifically. They can be any type of MOSgated device including IGBTs. Further, the die may be silicon-based or III Nitride heterojunction (GaN) type devices. Such devices may also be lateral power devices.

Figure 2:
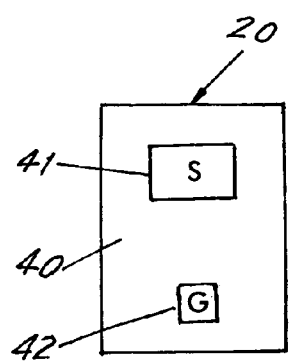
FIG. 2 is a top view of one of the MOSFETs of FIG. 1, showing the source and gate solderable electrodes on one surface.
Figure 3:
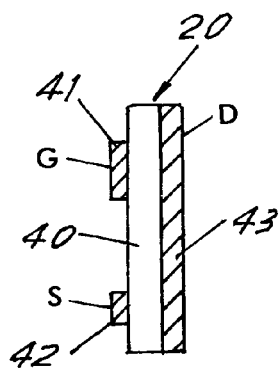
FIG. 3 is a vertical cross section of the die of FIG. 2.
Figure 4:
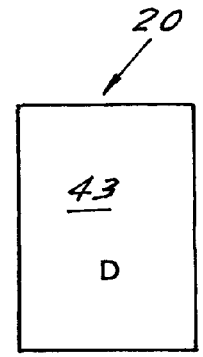
FIG. 4 is a rear view of the MOSFET of FIGS. 2 and 3, showing the drain solderable electrode.

FIGS. 2, 3 and 4 show typical MOSgated device 20 as comprising a semiconductor die 40 having solderable source and gate electrodes 41 and 42 on one surface and solderable drain 43 electrode on the opposite surface. MOSFET 21 may have a similar topology.

The novel package 22 for containing die 20 and 21 (or other semiconductor die) is shown in FIGS. 7 to 13.

Figure 5:
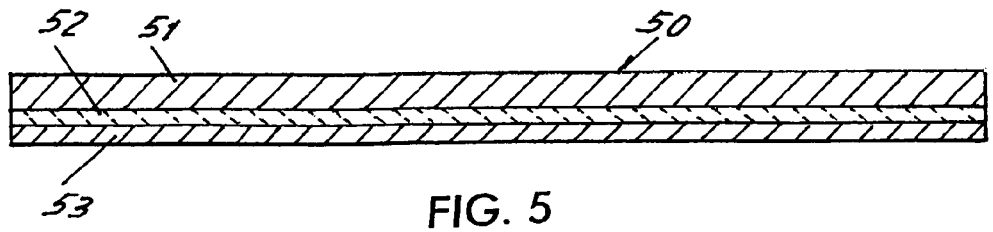
FIG. 5 is a cross-section of a composite housing body before it is shaped to a cup (et. A full cup or a U-shape).

Referring to FIG. 5, there is shown a composite strip 50 which can be formed to the shape of a can as by stamping or the like. By can is meant a web with downwardly bent rim sections to define either a generally shallow U-shaped strap on full can with a full downwardly bent rim, such as the structures of U.S. Pat. No. 6,624,522 (IR-1830) previously referred to.

Composite 50 is formed of a first relatively thick conductive layer 51 of copper or aluminum or the like, a thin dielectric film 52 bonded ot one surface of layer 51 and a thin conductive layer 53 which can be patterned as desired and which is bonded to the opposite surface of dielectric 52. The conductive layer 53 is very well thermally coupled to layer 51 through the very thin film 52.

Figure 6:
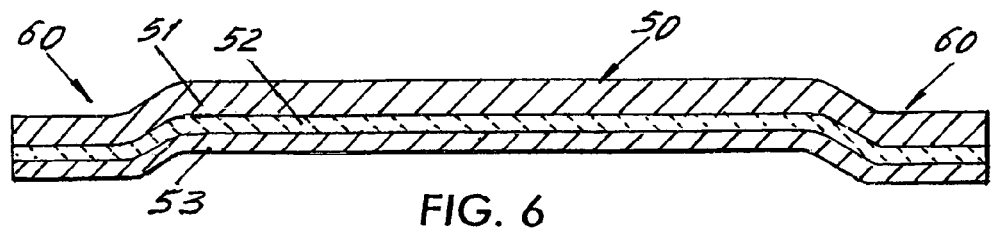
FIG. 6 shows the composite of FIG. 5 after its outer edges are formed to a peripheral rim.
Figure 7:
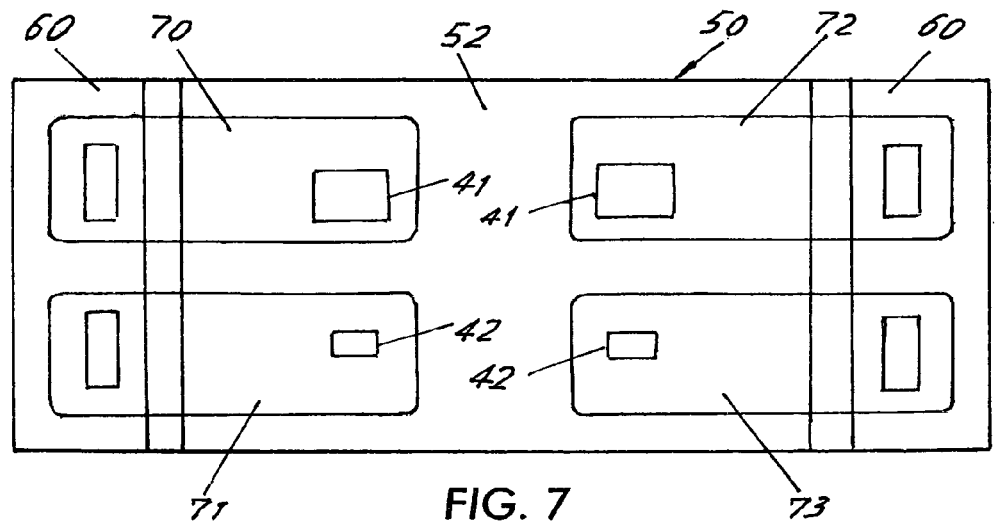
FIG. 7 shows the interior of the composite of FIG. 6 after the thin conductive layer has been patterned to form plural insulated tracks.
Figure 8:
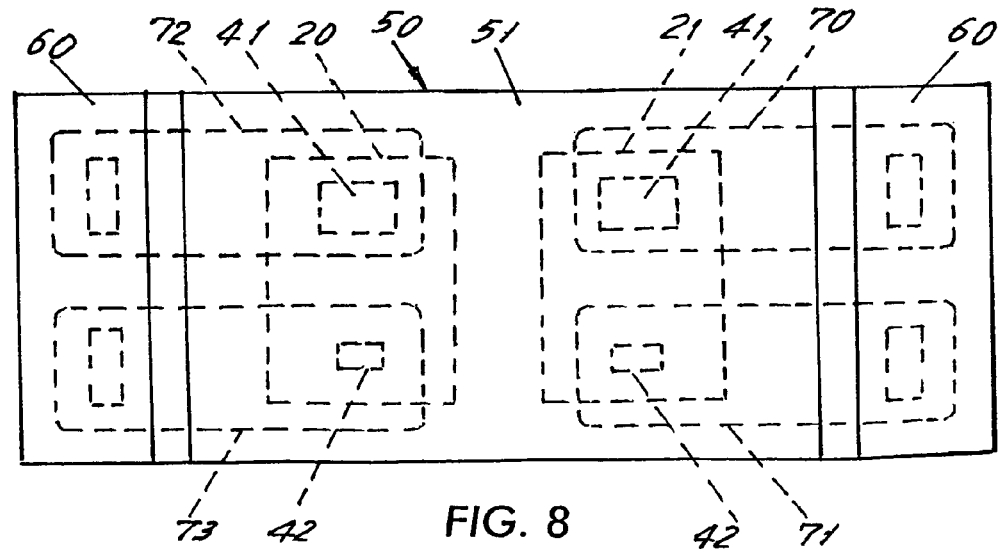
FIG. 8 is a top view of the composite of FIG. 7 after two die have been mounted in place within the web of the shallow cup.
Figure 9:
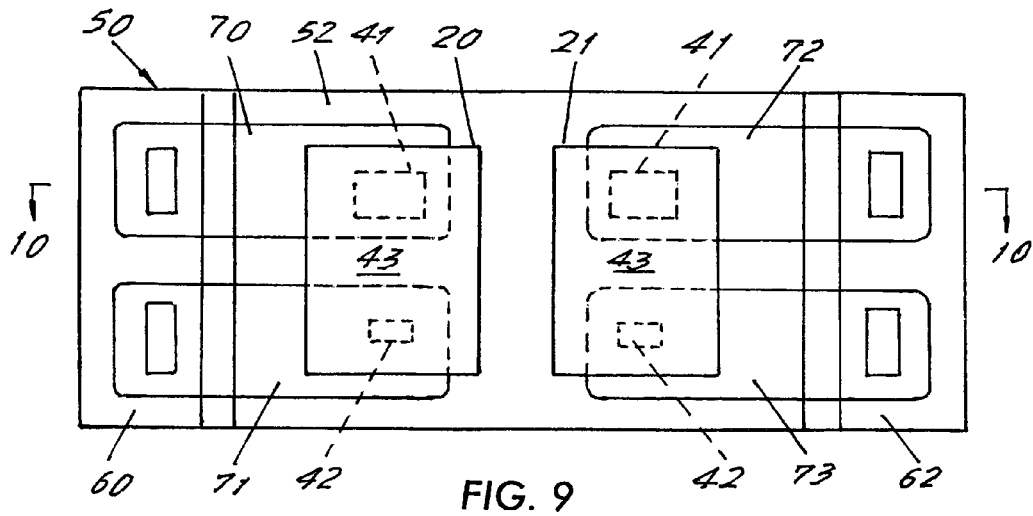
FIG. 9 is a view of the open cup of FIG. 7 with the die of FIG. 8 in place.
Figure 10:
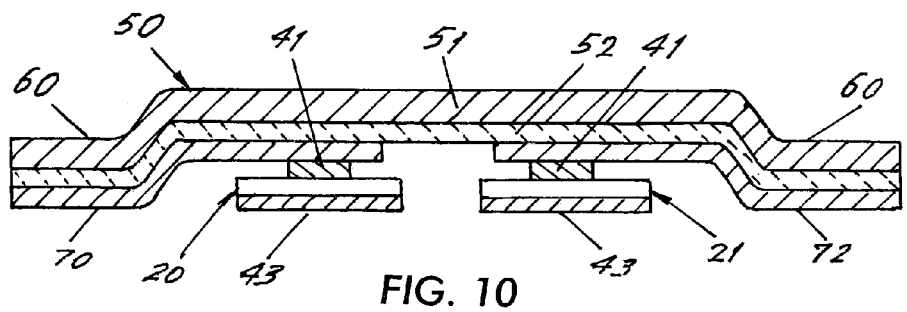
FIG. 10 is a cross-section of FIG. 9 taken across section line 10-10 in FIG. 9.

It should be noted that the composite 50 of FIG. 5 should be formable so that it can be stamped to form the downwardly bent rim 60 of FIG. 6, extending to the flat web section of the composite. Alternatively, the layer 51 can be stamped to shape as in FIG. 6 and the dielectric 52 and conductive layer 53 can be subsequently applied in any desired process. Still further, a thin flexible circuit board containing patterned traces, may be laminated or adhered to the inside of a prestamped lead frame structure containing an array of profiles similar to that of FIG. 6.

Figure 11:
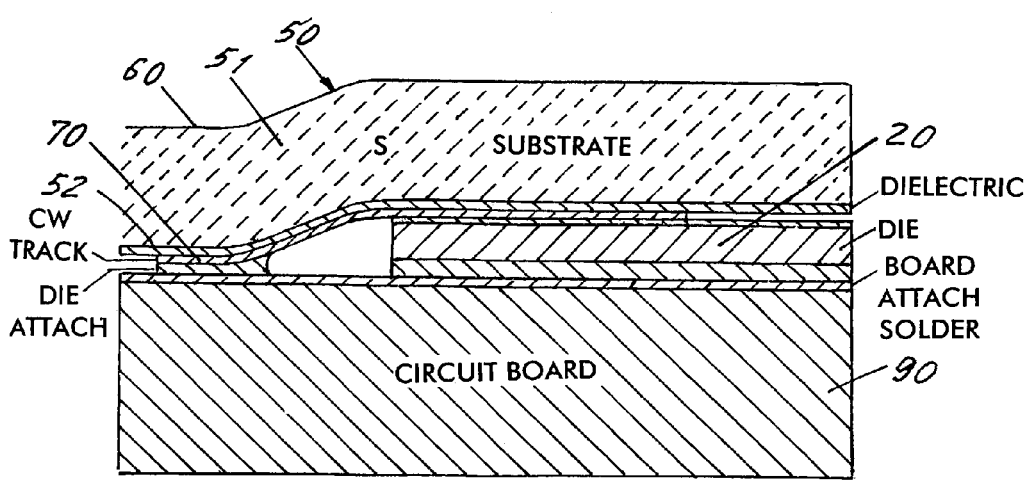
FIG. 11 is an enlarged view of a portion of package of FIG. 10 fastened to a circuit board.
Figure 12:
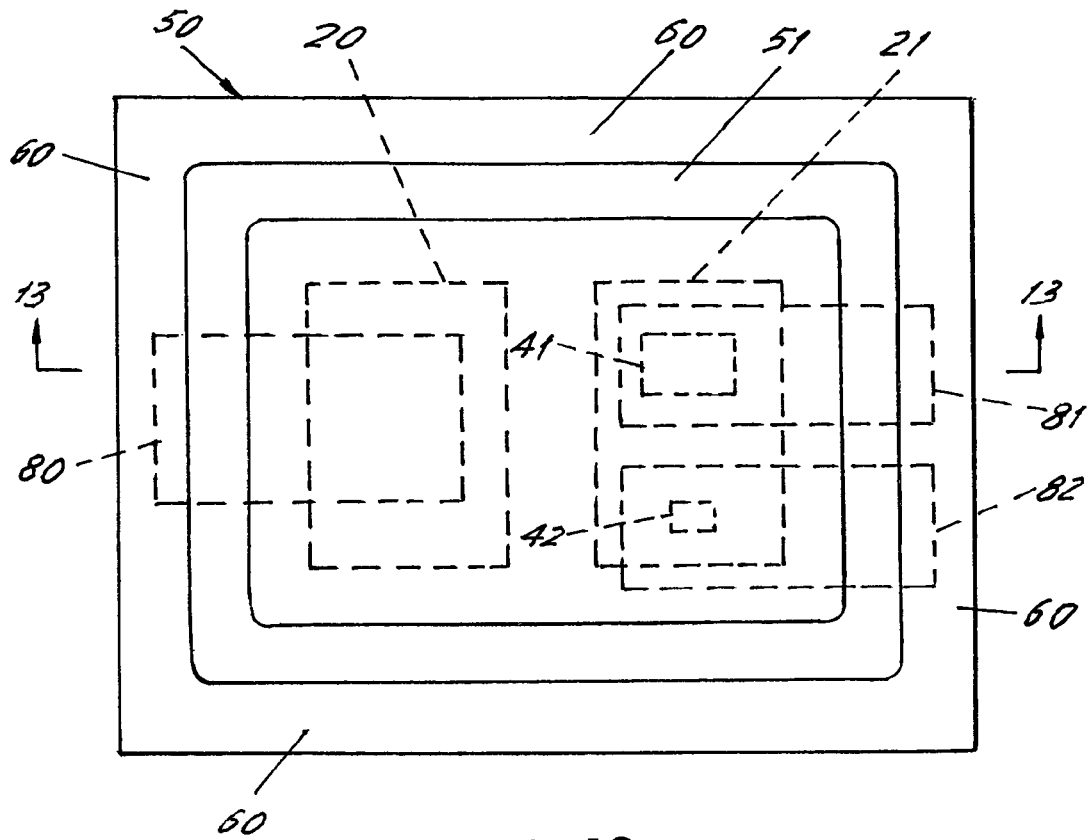
FIG. 12 is a top view of a second embodiment of the invention in which the composite is a full cup and the two die are mounted with drain side and source side respectively facing the interior of the cup.
Figure 13:
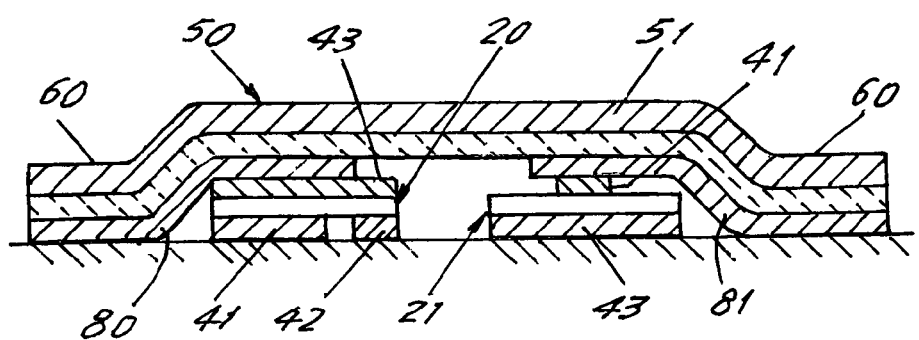
FIG. 13 is a cross-section of FIG. 12 taken across section line 13-13 in FIG. 12.

The thin conductive layer 53 is patterned, as by etching to form any desired conductive trace pattern, such as trace segments 70, 71, 72 and 73 in FIGS. 7 to 11 or segments 80, 81, and 82 in FIGS. 12 and 13. Any desired pattern can be used, depending on the geometry of the electrode configuration to be received.

Further, the patterns can be formed, either before or after the composite is stamped to shape as in FIG. 5 or 6.

Thereafter a solder paste or conductive epoxy or the like is dispensed on the die attach locations on the traces, and the die 20 and 21 are located as desired, as shown in FIGS. 8 to 11 or 12 and 13. Thus, in FIGS. 7 to 11, the die are located so that the source electrode 41 of die 20 and 21 are placed on traces 70 and 72 and gate electrode 42 of traces are placed on traces 71 and 73. Similarly, in FIGS. 11 and 12, drain electrode 43 of die 20 is placed on trace 80 and source and gate electrodes 41 and 42 of die 21 are placed on traces 81 and 82 respectively.

The solder paste connecting the electrodes to the conductive traces is then reflowed. A high melting solder is used since it must not reflow when attaching the component to a support board such as support board 90 in FIG. 11.

Note that all contacts at the open bottom of the composite are coplanar. Thus in FIG. 10, the terminals for traces 70 to 73, and the drain contacts 43 are coplanar for easy connection to a substrate such as the circuit board 90 in FIG. 11. The various source gate and drain electrodes can then be connected as desired by appropriate traces on the circuit board 90.

Similarly in FIG. 13, all terminals including the ends of insulated traces 80, 81 and 82 on the cup rim 60, the source and gate electrodes 41 and 42 of die 20 and the drain electrode 43 of die 21 are coplanar for attachment to corresponding traces on a circuit board or the like. The redistributed traces preferably have a solderable finish (e.g. nickel, gold, or nickel silver) to enable placement of die using conventional surface mount technology processes.

It should be specifically noted that the die 40 of FIGS. 11 and 13 could be lateral power mi Nitride heterojunction type die, or if desired one die 40 could be any desired type of power switch die and the other die a controller integrated circuit.

It is to be further noted that the above process can be used to simultaneously process a large number of packages on a common composite and, after an underfill operation if desired, and electrical test, the large area composite can be singulated into separate packages.

What is claimed is:

1. A package for copacking at least two semiconductor dies which each have parallel first and second surfaces and respective solderable first and second electrodes on said first and second surfaces; said package comprising:
a composite structure including a relatively thick electrically conductive metallic layer, a relatively thin electrically conductive patterned layer having at least first and second spaced segments, and a thin electrically insulating dielectric layer which bonds one surface of said patterned layer to one surface of said metallic layer, wherein peripheral edges of said composite structure include a rim which is downwardly bent in a direction perpendicular to a remaining flat central web thereof to define a flat cup shape;
said first electrodes of said at least two semiconductor dies being electrically connected to said first and second spaced segments;
said second electrodes of said at least two semiconductor dies being substantially coplanar;
said first and second spaced segments extending to opposite edges of said composite structure to define first and second terminals of said package;
said second electrodes defining at least third and fourth terminals for said package;
said at least two semiconductor dies being closely thermally coupled to said metallic layer through said dielectric layer.

2. The package of claim 1, wherein said first and second terminals are disposed on the flat central web and at least said first terminals are dispensed on said downwardly bent rim and are generally planar with said at least third and fourth terminals.

3. The package of claim 2, wherein said composite structure is an insulated metal substrate (IMS).

4. The package of claim 2, wherein at least one of said semiconductor dies is a MOSgated semiconductor die.

5. The package of claim 2, wherein at least one of said semiconductor dies is an integrated circuit for the control of at least one other semiconductor die.

6. The package of claim 2, wherein said semiconductor dies are MOSFETs and wherein said first and second electrodes are source and drain electrodes respectively; the source of one semiconductor die being connectable to the drain of one other semiconductor die to define a half bridge circuit.

7. The package of claim 1, wherein one of said semiconductor dies has a third electrode which is coplanar with its first electrode, and wherein said patterned layer has a third segment spaced from said first and second segments; said third electrode being electrically connected to said third segment; said third segment extending to said rim of said composite structure and being coplanar with said first and second terminals.

8. The package of claim 7, wherein said composite structure is an insulated metal substrate (IMS).

9. The package of claim 7, wherein at least one of said semiconductor dies is a MOSgated semiconductor die.

10. The package of claim 7, wherein at least one of said semiconductor dies is an integrated circuit for the control of at least one other semiconductor die.

11. The package of claim 7, wherein said semiconductor dies are MOSFETs and wherein said first and second electrodes are source and drain electrodes respectively; the source of one semiconductor die being connectable to the drain of one other semiconductor die to define a half bridge circuit.

12. The package of claim 7, wherein said third electrode is a gate electrode.

13. The package of claim 1, wherein said composite structure is an insulated metal substrate (IMS).

14. The package of claim 13, wherein at least one of said semiconductor dies is an integrated circuit for the control of at least one other semiconductor die.

15. The package of claim 1, wherein at least one of said semiconductor dies is a MOSgated semiconductor die.

16. The package of claim 1, wherein at least one of said semiconductor dies is an integrated circuit for the control of at least one other semiconductor die.

17. The package of claim 1, wherein said semiconductor dies are MOSFETs and wherein said first and second electrodes are source and drain electrodes respectively; the source of one semiconductor die being connectable to the drain of one other semiconductor die to define a half bridge circuit.

18. A package for copacking at least two semiconductor dies, said package comprising:
a composite structure including a relatively thick electrically conductive metallic layer, a relatively thin electrically conductive patterned layer having at least first and second spaced segments, and a thin electrically insulating dielectric layer which bonds one surface of said patterned layer to one surface of said metallic layer, wherein peripheral edges of said composite structure include a rim which is downwardly bent in a direction perpendicular to a remaining flat central web thereof to define a flat cup shape;
said first and second spaced segments extending to opposite edges of said composite structure to define first and second terminals of said package; and
third and fourth terminals of said package disposed on said first and second semiconductor dies, respectively, and being coplanar with said rim of said composite structure;
said at least two semiconductor dies being closely thermally coupled to said metallic layer through said dielectric layer.

19. The package of claim 18, wherein said first and second terminals are disposed on the flat central web and at least said first terminal is dispensed on said downwardly bent rim and is generally planar with said third and fourth terminals.

20. The package of claim 18, wherein one of said semiconductor dies has coplanar first and second electrodes, and wherein said patterned layer has a third segment spaced from said first and second segments; one of said first and second electrodes being electrically connected to said third segment; said third segment extending to said rim of said composite structure and being coplanar with said first and second terminals.

* * * * *